United States Patent
Chidambarrao et al.

(10) Patent No.: US 8,013,397 B2
(45) Date of Patent: Sep. 6, 2011

(54) EMBEDDED STRESSED NITRIDE LINERS FOR CMOS PERFORMANCE IMPROVEMENT

(75) Inventors: Dureseti Chidambarrao, Weston, CT (US); Omer H. Dokumaci, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 675 days.

(21) Appl. No.: 12/049,450

(22) Filed: Mar. 17, 2008

(65) Prior Publication Data

US 2008/0164532 A1    Jul. 10, 2008

Related U.S. Application Data

(63) Continuation of application No. 10/851,828, filed on May 21, 2004, now Pat. No. 7,361,973.

(51) Int. Cl.
*H01L 27/00* (2006.01)

(52) U.S. Cl. ...................................... 257/369

(58) Field of Classification Search .............. 257/369, 257/29, 315, 316, E21.703, 649, 623, E29.049–E29.067, 257/E29.237, E29.256–E29.26, E21.428–E21.43, 257/E21.618, E21.431–E21.435, E21.619–E21.62, 257/223, 227, 291, 292, 439, 443, 655, E27.1, 257/E27.125, E27.112, E29.117, E29.145, 257/E29.147, E29.151, E29.182, E29.202, 257/E29.273–E29.299, E29.314, E29.32
See application file for complete search history.

(56) References Cited

U.S. PATENT DOCUMENTS

| | | | |
|---|---|---|---|
| 4,424,621 A | 1/1984 | Abbas et al. | |
| 5,439,839 A | 8/1995 | Jang | |
| 6,017,801 A | 1/2000 | Youn | |
| 6,492,216 B1 | 12/2002 | Yeo et al. | |
| 6,541,343 B1 | 4/2003 | Murthy et al. | |
| 6,573,172 B1 | 6/2003 | En et al. | |
| 6,602,771 B2 | 8/2003 | Inoue et al. | |
| 6,855,592 B2 | 2/2005 | Lee | |
| 6,870,179 B2 * | 3/2005 | Shaheed et al. | 257/29 |
| 6,916,718 B2 | 7/2005 | Chen et al. | |
| 6,960,781 B2 | 11/2005 | Currie et al. | |
| 2001/0001212 A1 * | 5/2001 | Gambino et al. | 257/315 |
| 2003/0228724 A1 | 12/2003 | Koyama | |
| 2004/0217420 A1 | 11/2004 | Yeo et al. | |
| 2005/0093078 A1 | 5/2005 | Chan et al. | |
| 2005/0093105 A1 | 5/2005 | Yang et al. | |
| 2005/0110082 A1 * | 5/2005 | Cheng et al. | 257/341 |
| 2005/0116360 A1 | 6/2005 | Huang et al. | |
| 2005/0158955 A1 | 7/2005 | Yang et al. | |

OTHER PUBLICATIONS

Jeffrey A. Davis, et al., "Interconnect Limits on Gigascale Integration (GSI) in the 21$^{st}$ Century", *Proceedings of the IEEE*, vol. 89, No. 3, pp. 305-324 (2001).

(Continued)

*Primary Examiner* — Dao H Nguyen
*Assistant Examiner* — Tram H Nguyen
(74) *Attorney, Agent, or Firm* — Scully, Scott, Murphy & Presser, P.C.; Wenjie Li (57) ABSTRACT

The present invention provides a semiconducting device including a gate region positioned on a mesa portion of a substrate; and a nitride liner positioned on the gate region and recessed surfaces of the substrate adjacent to the gate region, the nitride liner providing a stress to a device channel underlying the gate region. The stress produced on the device channel is a longitudinal stress on the order of about 275 MPa to about 450 MPa.

18 Claims, 9 Drawing Sheets

OTHER PUBLICATIONS

"Grand Challenges", *The International Technology Roadmap for Semiconductors*, pp. 9-15 (2002).

Shinya Ito, et al., "Mechanical Stress Effect of Etch-Stop Nitride and its Impact on Deep Submicron Transistor Design", *IEEE Electron Devices Meeting*, 247-250 (2000).

* cited by examiner

EMBEDDED STRESSED NITRIDE LINERS FOR CMOS PERFORMANCE IMPROVEMENT

RELATED APPLICATION

This application is a continuation of U.S. patent application Ser. No. 10/851,828 filed May 21, 2004.

FIELD OF THE INVENTION

The present invention relates to semiconductor materials having enhanced electron and hole mobilities, and more particularly, to semiconductor materials that include a silicon (Si)-containing layer having enhanced electron and hole mobilities. The present invention also provides methods for forming such semiconductor materials.

BACKGROUND OF THE INVENTION

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. A concise summary of near-term and long-term challenges to continued CMOS scaling can be found in the "Grand Challenges" section of the 2002 Update of the International Technology Roadmap for Semiconductors (ITRS). A very thorough review of the device, material, circuit, and systems can be found in Proc. IEEE, Vol. 89, No. 3, March 2001, a special issue dedicated to the limits of semiconductor technology.

Since it has become increasingly difficult to improve MOSFETs and therefore complementary metal oxide semiconductor (CMOS) performance through continued scaling, methods for improving performance without scaling have become critical. One approach for doing this is to increase carrier (electron and/or hole) mobilities. Increased carrier mobility can be obtained, for example, by introducing an appropriate strain into the Si lattice.

The application of stress changes the lattice dimensions of the silicon (Si)-containing substrate. By changing the lattice dimensions, the energy gap of the material is changed as well. The change may only be slight in intrinsic semiconductors resulting in a small change in resistance, but when the semiconducting material is doped, i.e., n-type, and partially ionized, a very small change in energy bands can cause a large percentage change in the energy difference between the impurity levels and the band edge. Thus, the change in resistance of the semiconducting material with stress is large.

Compressive longitudinal stress along the channel increases drive current in p-type field effect transistors (pFET) and decreases drive current in n-type field effect transistors (nFET). Tensile longitudinal stress along the channel increases drive current in nFETs and decreases drive current in pFETs.

Figure 1:
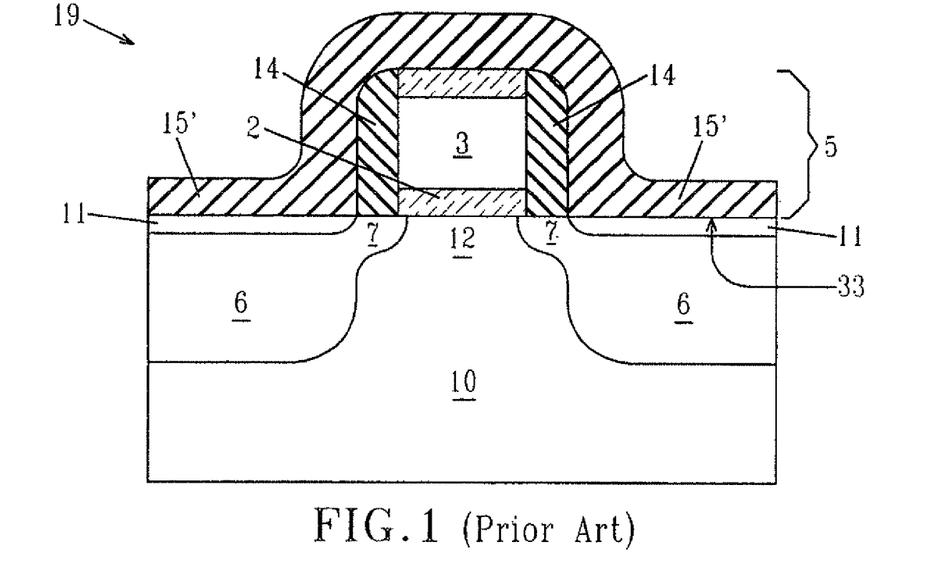
FIG. 1 is a pictorial representation (through a cross-sectional view) showing a prior gate region incorporating a nitride liner deposited atop the gate region and atop the top surface of a planar substrate.

Nitride liners positioned atop field effect transistors (FETs) have been proposed as a means to provide stress based device improvements. Referring to FIG. 1, a prior field effect transistor (FET) 19 is provided including a nitride liner 15' positioned on a gate region 5 and atop a planar substrate surface 33, in which the nitride liner 15' produces a stress on the device channel 12. The device channel 12 is located between source/drain regions 6 and source/drain extension regions 7. The source/drain regions 6 further comprise silicide regions 11. The gate region 5 includes a polysilicon gate 3 atop a gate dielectric 2. Sidewall spacers 14 abut the gate region 5. The stress transfer in this prior FET is limited and the typical channel stress produced by the nitride liner 15' ranges from about 150 MPa to about 200 MPa.

There is a continued need to produce higher stresses on the channel of the device than previously possible using nitride liners, in which the stress provides stress based device improvements.

SUMMARY

One object of the present invention is to provide a field effect transistor (FET) having a nitride liner that produces a compressive or tensile stress on the channel region of the device at a magnitude greater than previously known limits. This objective is provided by a nitride liner deposited atop a FET, in which the nitride liner is formed atop a gate region on a mesa portion of a substrate and the nitride liner is formed atop a recessed surface of the substrate, in which the recessed surface of the substrate is vertically offset from the mesa portion of the substrate. The recessed surface of the substrate farther comprises silicide regions. A portion of the nitride liner formed atop the recessed surface of the substrate is positioned below the top surface of the mesa portion of the substrate, in which this portion of the nitride liner may be described as partially embedded.

Broadly, the inventive semiconducting device comprises: a gate region positioned on a mesa portion of a substrate; and a nitride liner positioned on at least the gate region and located on recessed surfaces of the substrate adjacent to the gate region, the nitride liner providing a stress to a device channel underlying the gate region.

On either side of the gate region, the nitride liner of the present invention is located on recessed surfaces of the substrate, in which the recessed surfaces lie below the top surface of the mesa portion of substrate that the gate region is positioned on. The upper surface of each recessed portion of the substrate further comprises a silicide contact and is vertically offset from the top surface of the mesa portion of the substrate by a depth ranging from about 10 nm to about 80 nm. In silicon-on-insulating (SOI) substrates, the surface of the substrate may not be recessed into the buried insulating layer. The nitride liner can comprise of $Si_3N_4$ and can have a thickness ranging from about 40 nm to about 100 nm.

The gate region comprises a gate conductor atop a gate dielectric. The gate region can further include sidewall spacers abutting the gate conductor and the gate dielectric. The recessed portions of the substrate flanking the gate region further comprise source/drain regions. The device channel of the substrate is positioned below the gate region in the mesa portion of the substrate and the stress produced on the critical channel region is a longitudinal stress on the order of about 250 MPa to about 450 MPa. The critical channel region may be positioned at a depth of approximately 5 nm or less from the gate region. In comparison to prior FETs having nitride liners atop a gate region and coplanar substrate as depicted in FIG. 1, the present invention provides an increase in device performance ranging from about 10% to about 50%.

In another embodiment of the present invention, the nitride liner may be positioned in closer proximity to the gate conductor of the gate region by removing the sidewall spacers that abut the gate conductor. In this embodiment, a step region of the substrate is provided on each side of the gate conductor. In broad terms, this embodiment of the inventive semiconducting device comprises:

a substrate comprising a mesa surface and a recessed surface adjacent thereto;

a gate region on a portion of the mesa surface of the substrate, wherein a remaining portion of the mesa surface of the substrate provides step regions to the recessed surface of the substrate; and a nitride liner positioned on the gate region, the step region, and the recessed surface of the substrate, the nitride liner providing a stress to a device channel underlying the gate region.

Another aspect of the present invention is a method of forming the above described gate regions, which include a nitride liner that provides a longitudinal stress within the underlying portion of the substrate on which the gate region is formed. Broadly, the method of present invention comprises the steps of:

forming a gate region atop a portion of a substrate;
forming sidewall spacers abutting the gate region;
forming a hardmask atop the gate region;
etching the substrate selective to the hardmask and the sidewall spacers to form a recessed substrate surface offset from the portion of the substrate on which the gate region is formed; and
forming a nitride liner on at least the gate region and the recessed substrate surface, wherein the nitride liner provides a stress to the portion of the substrate underlying the gate region.

The gate region may be formed by depositing a gate dielectric layer; depositing a gate conductor; and then etching the gate conductor and the gate dielectric using photolithography and etching. Sidewall spacers may then be formed abutting the gate region and source/drain regions. The exposed surfaces of the substrate adjacent to the gate region are etched, using a directional etch process, to form recessed substrate surfaces. The recessed substrate surfaces further comprise silicide regions. The substrate surface is recessed by about 10 nm to about 80 nm. If the substrate is an SOI substrate, the substrate surface may not be recessed into the buried insulating layer. The nitride liner is then formed atop the gate region and the recessed surface of the substrate by plasma enhanced chemical vapor deposition or rapid thermal chemical vapor deposition. The nitride liner may be deposited under conditions that produce a compressive stress or a tensile stress.

BRIEF DESCRIPTION OF THE DRAWINGS

FIGS. 7-12 are pictorial representations (through cross-sectional views) showing the basic processing steps that are employed to produce the inventive semiconducting structure. FIGS. 7-10 represent the initial process steps for producing the semiconducting structure depicted in FIGS. 2 and 3. FIGS. 11(a)-12(a) depict the final process steps for producing the semiconducting structure depicted in FIG. 2. FIGS. 11(b)-12(b) depict the final process steps for producing the semiconducting structure depicted in FIG. 3.

DETAILED DESCRIPTION OF THE INVENTION

The present invention provides a field effect transistor (FST), and a method of forming thereof comprising a gate structure on a semiconducting substrate, in which a longitudinal stress is applied to a portion of the semiconducting substrate underlying the gate structure to increase the FET's performance. The present invention advantageously provides a longitudinal stress to the portion of the substrate underlying the gate region by forming a nitride liner positioned on the gate region and atop recessed portions of the substrate adjacent to the gate region, in which a portion of the nitride liner is embedded below the top surface of the substrate on which the gate region is formed. The present invention is now discussed in more detail referring to the drawings that accompany the present application. In the accompanying drawings, like and or corresponding elements are referred to by like reference numbers.

Figure 2:
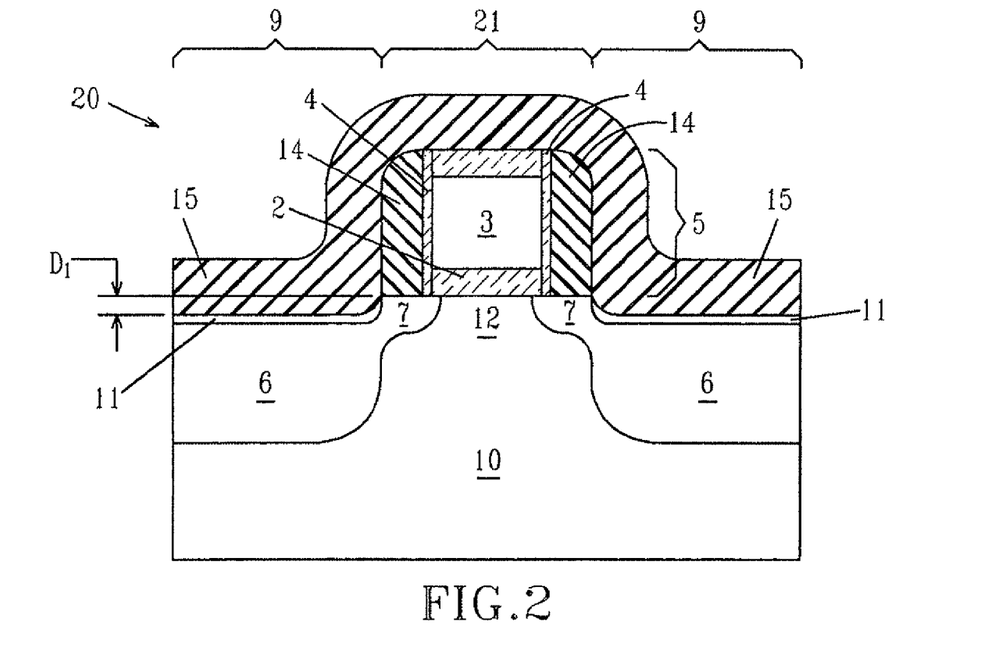
FIG. 2 is a pictorial representation (through a cross-sectional view) of one embodiment of the inventive semiconducting device incorporating a nitride liner formed atop the gate region and atop a recessed surface of the substrate, in which the nitride liner is embedded.

Referring to FIG. 2, in one embodiment of the present invention, a field effect transistor (FET) 20 is provided, in which a longitudinal stress is produced in the device channel 12. The longitudinal stress in the device channel 12 of the FET is provided by a nitride liner 15 positioned atop the gate region 5 and atop the recessed surfaces 9 of the substrate 10 adjacent to the gate region 5. The recessed surfaces 9 of the substrate 10 are vertically offset $D_1$ from the top surface of the mesa portion 21 of the substrate 10, wherein the gate region 5 is formed atop the top surface of the mesa portion 21 of the substrate 10. The top surface of the recessed portion 9 of the substrate 10 is recessed to a depth $D_1$ ranging from about 10 nm to about 80 nm from the top surface of the mesa portion 21 of the substrate 10. The recessed portion 9 of the substrate further comprises silicide regions 11.

The gate region 5 comprises a gate conductor 3 atop a gate dielectric 2. Sidewall spacers 14 abut the gate region 5. The substrate 10 further comprises source/drain regions 6 that are substantially aligned to the overlying sidewall spacers 14 and extension regions 7 that extend beneath the sidewall spacers 14. A channel 12 is positioned between the extension regions 7 and beneath the gate region 5. The recessed portion 9 of the substrate 10 is aligned with the outer surface of the sidewall spacers 14.

A nitride liner 15, preferably comprising $Si_3N_4$, is positioned atop the gate region 5, the sidewall spacer 14, and the recessed portion 9 of the substrate 10. The nitride liner 15 has a thickness ranging from about 40 nm to about 100 nm. The nitride liner 15 produces a longitudinal stress of the channel of the device ranging from about 250 MPa to about 450 MPa. Preferably, the greatest stress produced by the nitride liner 15 is in the portion of the device channel 12 positioned at a depth of approximately 5 nm or less from the gate region 5.

Figure 3:
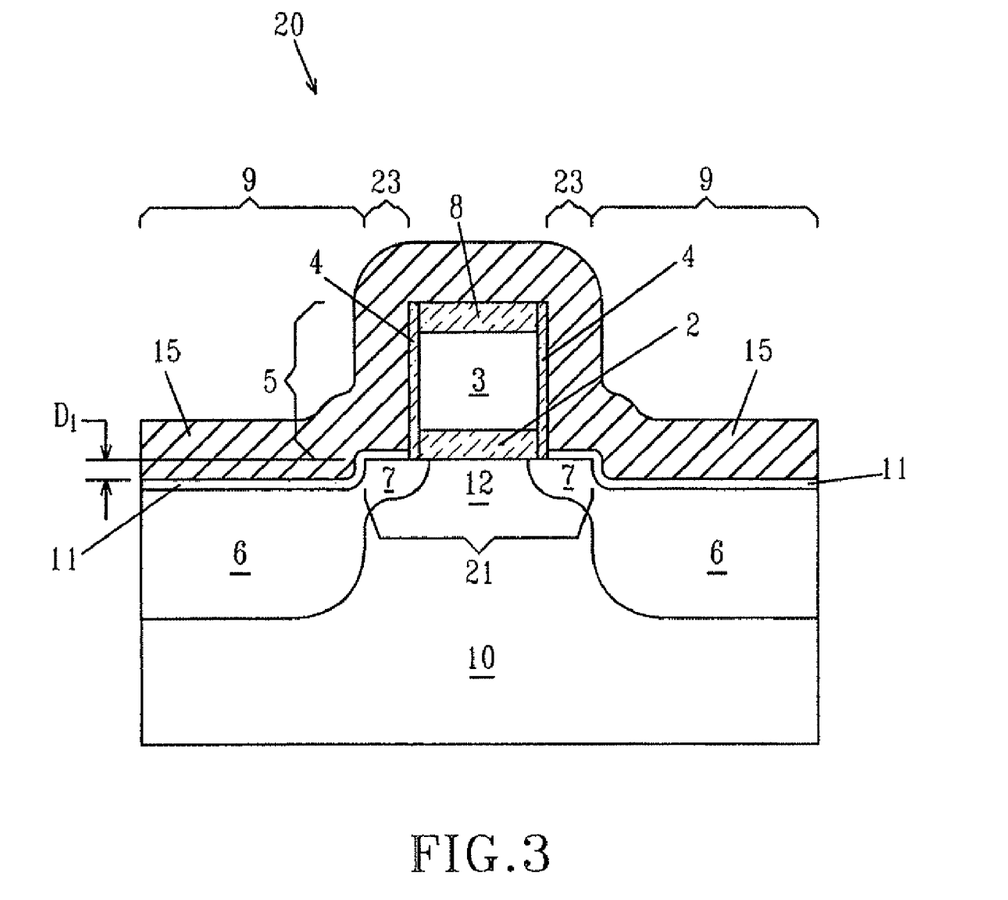
FIG. 3 is a pictorial representation (through a cross-sectional view) of another embodiment of the inventive gate region incorporating a nitride liner formed atop the gate region, atop a step region of the substrate that flanks the gate region, and atop a recessed surface of the substrate.

Referring to FIG. 3, in another embodiment of the present invention, the sidewall spacers 14 are removed prior to forming the nitride liner 15. In this embodiment, the gate region 5 is positioned on a centered portion of the mesa surface 21 of the substrate 10, in which step regions 23 adjacent to the centered portion of the mesa surface 21 serve as the transition between the mesa surface 21 and the recessed surface 9. The mesa surface 21 is offset from the recessed surface 9 of the substrate 10 by a depth $D_1$ ranging from about 10 nm to about 100 nm.

In this embodiment, the nitride liner 15 is positioned on the gate region 5, the step region 23, and the recessed surface 9 of the substrate 10, and provides a stress to the device channel 12 of the substrate 10 ranging from about 350 MPa to about 550 MPa. Similar to the FET depicted in FIG. 2, the FET depicted in FIG. 3 further comprises a gate conductor 3, gate dielectric 2, source/drain regions 6, and source/drain extension regions 7. An advantage of this embodiment is that the stress from the nitride liner 15 is brought as close as possible to the channel region 12 of the device, therefore achieving the greatest stress within the channel 12.

The stress produced by the inventive nitride liners depicted in FIGS. 1 and 2 are now described in more detail. The stress produced by the inventive nitride liner 15, as depicted in FIG. 2, is described with reference to the stress simulation depicted in FIG. 5. For comparative purposes, the stress produced by a prior nitride liner 15', as depicted in FIG. 1, is described with reference to the stress simulation depicted in FIG. 4. The x-axis and y-axis of the stress simulations depicted in FIGS. 4 and 5 represent distance in microns.

Figure 4:
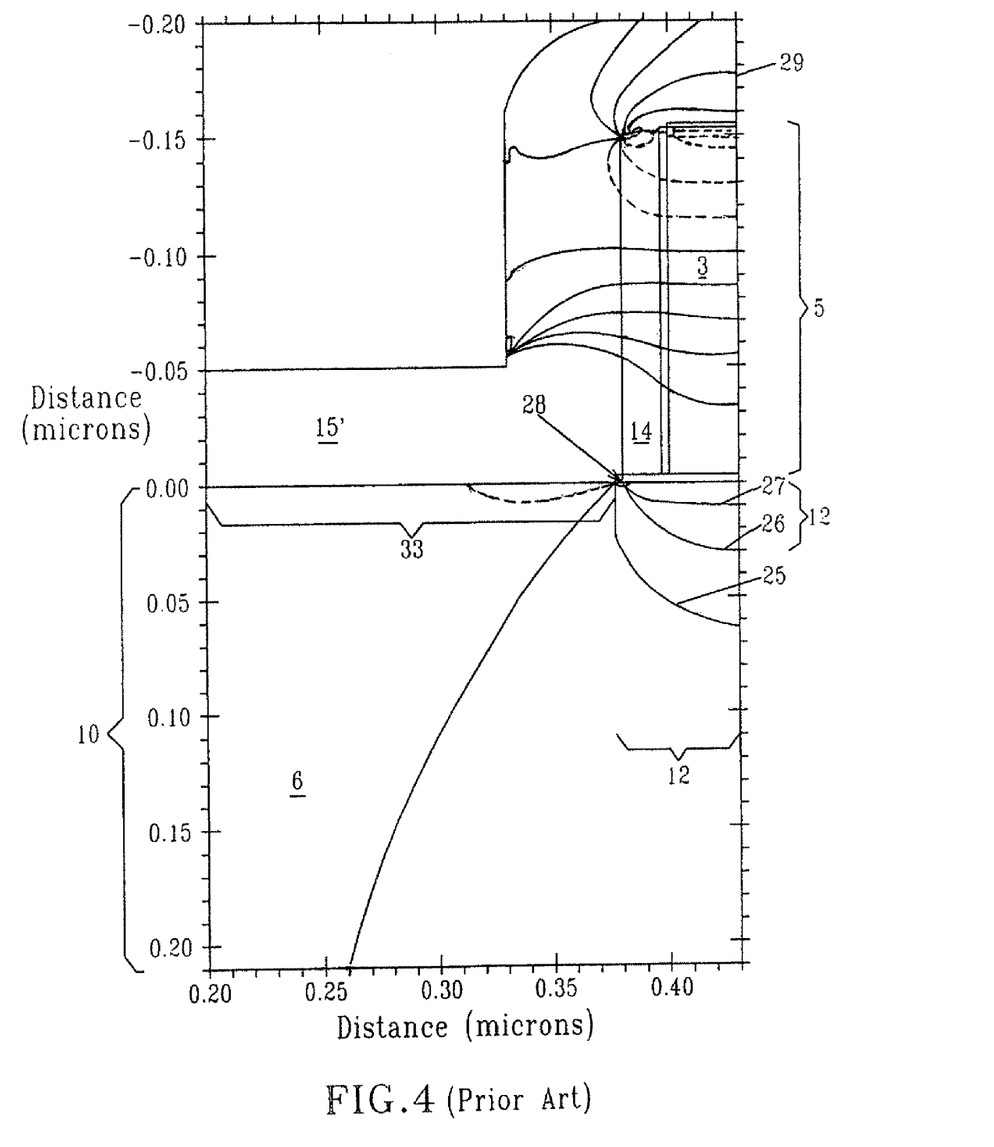
FIG. 4 depicts (through cross-sectional view) the stress produced in a prior semiconducting device having a nitride liner, as depicted in FIG. 1.
Figure 5:
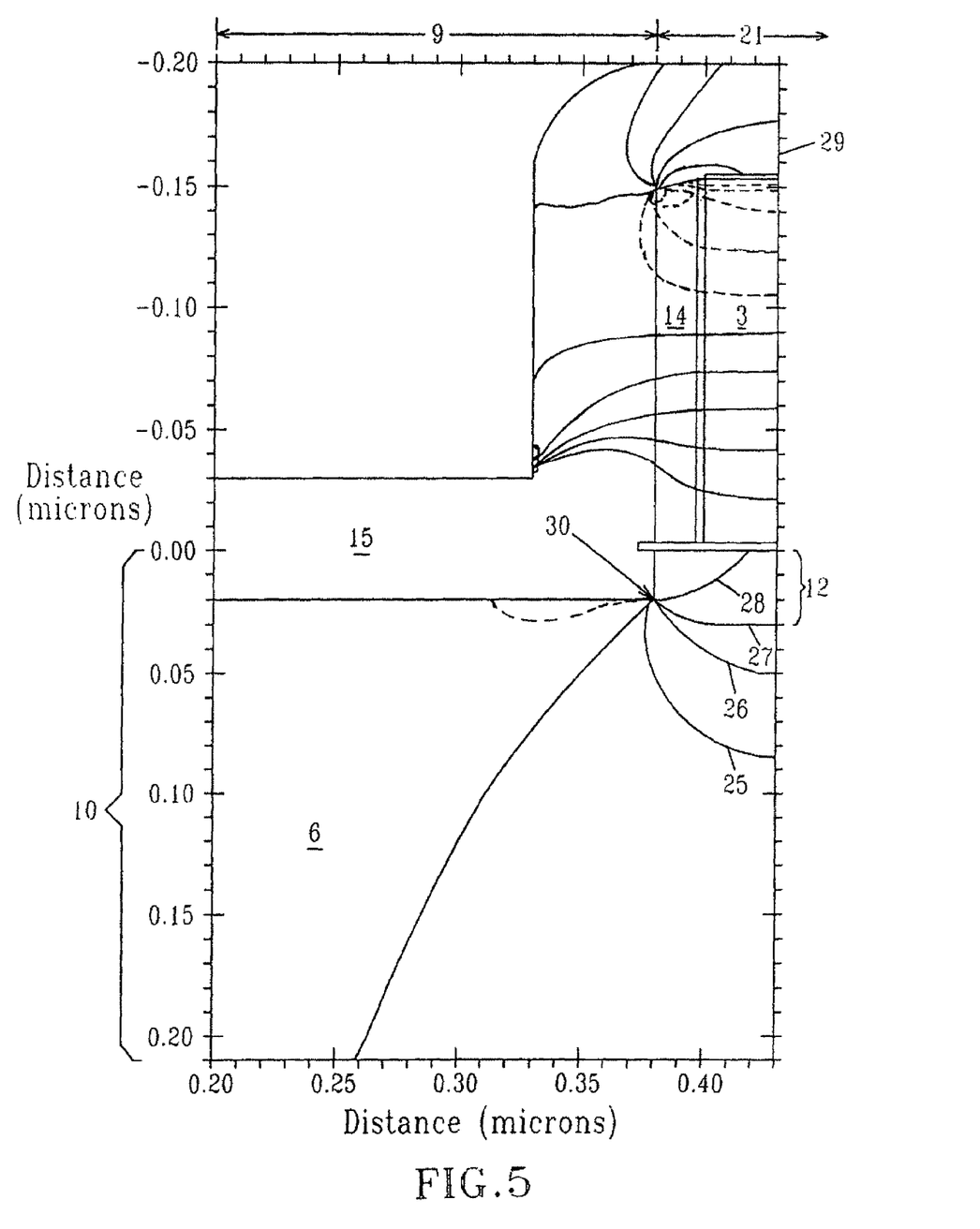
FIG. 5 depicts (through cross-sectional view) the stress produced in one embodiment of the inventive semiconducting device incorporating an embedded nitride liner deposited atop the gate region and atop a recessed surface of the substrate, as depicted in FIG. 2.

Referring to FIG. 4, a stress simulation is provided depicting half of a prior FET 19, where the centerline 29 of the gate conductor 3 is positioned on the z-axis. The centerline 29 of the channel region 12 is also positioned on the z-axis. The prior nitride liner 15' is formed atop the gate region 5 and atop a planar surface 33 of the substrate 10 to provide a stress to the channel region 12 of the device. The stress lines 25, 26, 27 illustrated in FIG. 4 are measured from the top surface of the substrate 10.

Still referring to the stress simulation depicted in FIG. 4, the prior nitride liner 15' produces a stress on the channel 12 of the device, where the stress extends from the nitride liner/gate interface 28 to the channel region 12. A 100 MPa stress line 25 indicates that a stress of approximately 100 MPa is produced in the portion of the channel 12 underlying the sidewall of the gate conductor 2 at a depth of approximately 40 nm; and a stress of approximately 100 MPa is produced at the centerline 29 of the channel at a depth of approximately 60 nm.

A 200 MPa stress line 26 is depicted extending from the nitride liner/gate interface 28 into the channel region 12. The 200 MPa stress line 26 indicates that a stress of approximately 200 MPa is produced at the portion of the channel 12 underlying the sidewall of the gate conductor 2 at a depth of approximately 20 nm; and that a stress of 200 MPa is produced at the centerline 29 of the channel 12 at a depth of approximately 30 nm.

A 300 MPa stress line 27 is depicted extending from the nitride liner/gate interface 28 into the channel region 12. The 300 MPa stress line 27 indicates that a stress of approximately 300 MPa is produced at the portion of the channel 12 underlying the sidewall of gate conductor 2 at a depth of approximately 10 nm; and that a stress of approximately 300 MPa is produced at the centerline 29 of the channel 12 at a depth of approximately 10 nm.

Referring now to FIG. 5, a stress simulation is provided depicting half of the FET 20 of the present invention, in which the recessed portion 9 of the substrate 10 is recessed 20 nm from the mesa portion 21 of the substrate 10. The inventive nitride liner 15 is positioned atop the gate region 5 and the recessed portions 9 of the substrate 10 adjacent to the gate region 5. The centerline 29 of the gate region 5 and the device channel 12 is positioned on the z-axis. The stress lines 25, 26, 27, 28, depicted in FIG. 5, are measured from the portion of the mesa portion 21 of the substrate 10 on which the gate region 5 is positioned.

Still referring to the stress simulation depicted in FIG. 5, the inventive nitride liner 15, positioned on the recessed surfaces 9 of the substrate adjacent to the gate region 5, produces an increased longitudinal stress on the device channel region 12, when compared to prior nitride liners that are produced on planar substrate surfaces. The stress radiates from the nitride liner/recessed substrate surface interface 30 to the channel region 12 of the device. A 100 MPa stress line 25 indicates that a stress of approximately 100 MPa is produced at the portion of the channel 12 underlying the sidewall of the gate conductor 3 at a depth of approximately 75 nm; and a stress of approximately 100 MPa is produced at the centerline 29 of the channel region 12 at a depth of approximately 85 nm.

A 200 MPa stress line 26 is depicted extending from the nitride liner/recessed substrate surface interface 30 into the channel region 12. The 200 MPa stress line 26 indicates that a stress of approximately 200 MPa is produced at the portion of the channel 12 underlying the sidewall of the gate conductor 3 at a depth of approximately 40 nm; and that a stress of 200 MPa is produced at the centerline 29 of the channel 12 at a depth of approximately 50 nm.

A 300 MPa stress line 27 is depicted extending from the nitride liner/recessed substrate surface interface 30 into the channel region 12. The 300 MPa stress line 27 indicates that a stress of approximately 300 MPa is produced at the portion of the channel 12 underlying the sidewall of the gate conductor 3 at a depth of approximately 25 nm; and that a stress of approximately 300 MPa is produced at the centerline 29 of the channel region 12 at a depth of approximately 30 nm.

A 400 MPa stress line 28 is depicted extending from the nitride liner/recessed substrate surface interface 30 into the channel region 12. The 400 MPa stress line 28 indicates that a stress of approximately 400 MPa is produced at the portion of the channel 12 underlying the sidewall of the gate conductor 2 at a depth of approximately 15 nm. The 400 MPa stress line 28 indicates that a stress of approximately 400 MPa or greater is produced within the portion of the channel 12 at a depth of 10 nm or less.

The above stress simulations clearly indicate that positioning the nitride liner 15 atop a gate region 5 and atop substrate 10 having recessed surfaces 9 that are adjacent to the gate region 5, as depicted in FIG. 5, provides a greater longitudinal stress to the device channel 12 than prior nitride liners 15' that are formed atop a gate positioned on a planar substrate, as depicted in FIG. 4.

The stress produced in the device channel by the nitride liner can be varied by changing the thickness of the sidewall spacers that abut the gate region. The relationship between sidewall spacer width (nm) and the stress (MPa) produced in the channel is illustrated in the plot depicted in FIG. 6. The stress produced by the nitride liner of the present invention versus sidewall spacer width is plotted in recessed liner data line 31 and the stress produced by a prior nitride liner versus sidewall spacer width is plotted in comparative data line 32. The stress plotted in FIG. 6 was measured from the portion of the channel underlying the sidewall of the gate conductor 3 at a depth of approximately 5 nm.

Figure 6:
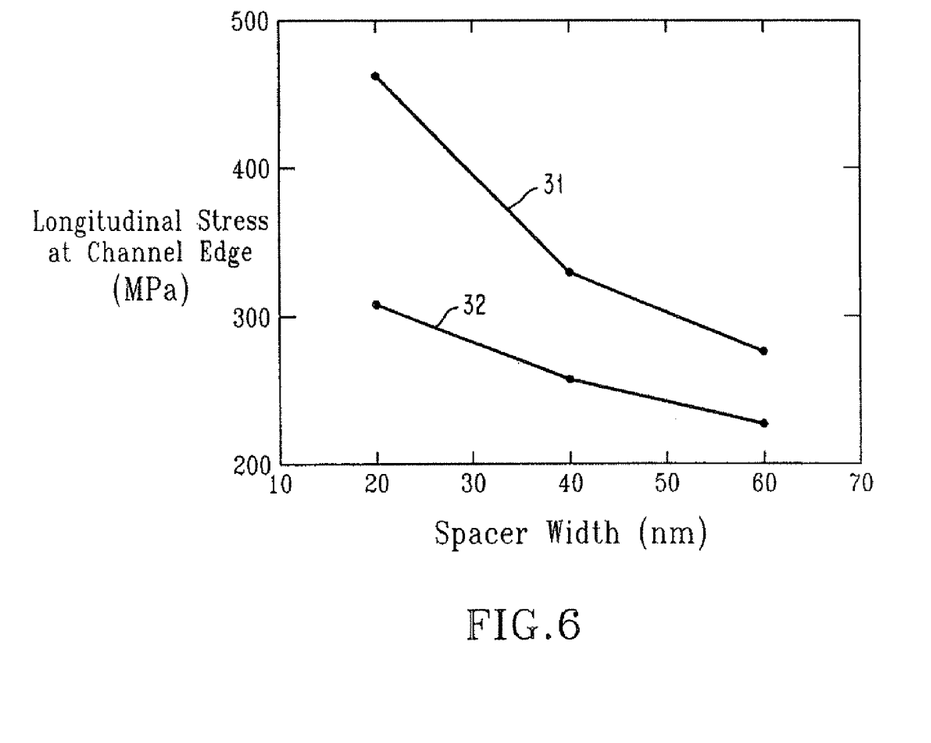
FIG. 6 is a plot of the internal stress within the channel produced by the nitride liner versus the thickness of the gate region sidewall spacer, where the internal stress is measured at a depth of 5 nm from the top surface of the substrate at the gate edge.

Still referring to FIG. 6, the recessed liner data line 31 indicates that the longitudinal stress produced in the device channel by a nitride liner formed on recessed surfaces of the substrate adjacent to the gate region ranges from approximately 450 MPa, when the spacer width is approximately 20 nm, to approximately 300 MPa, when the spacer width is approximately 60 nm. The comparative data line 32 indicates that the longitudinal stress produced by a prior nitride liner ranges from approximately 300 MPa, when the spacer width is approximately 20 mm, to approximately 225 MPa, when the spacer width is approximately 60 nm. It is noted that the above examples are provided for illustrative purposes only and do not limit the scope of the invention.

The methods for forming the inventive semiconducting structures are now described in greater detail referring to FIGS. 7-12. FIGS. 7-10 depict the initial process steps for forming the structure depicted in FIGS. 2 and 3. FIGS. 11(a)-12(a) depict the final method steps for forming the embodiment of depicted in FIG. 2. FIGS. 11(b)-12(b) depict the final method steps for forming the embodiment depicted in FIG. 3.

Figure 7:
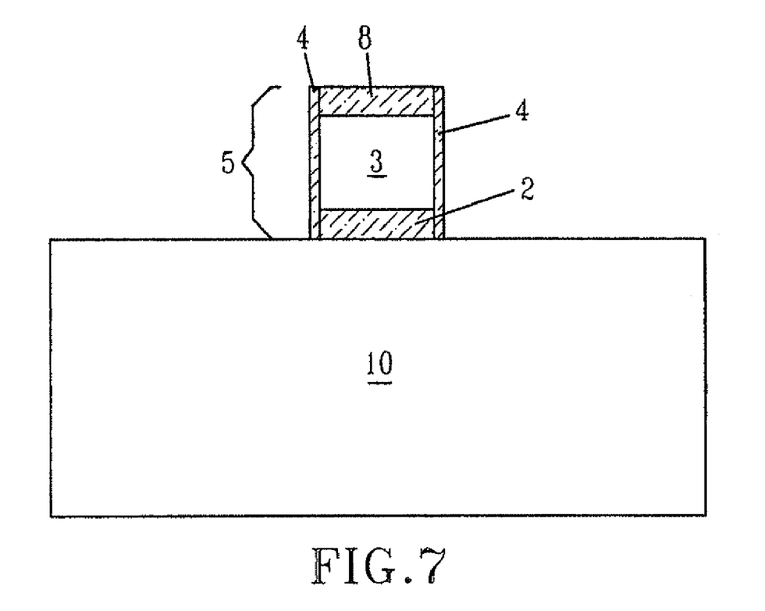

Referring to FIG. 7, a patterned gate region 5 is formed atop a substrate 10 utilizing conventional methods including deposition and lithography. Specifically, a gate stack is first provided by depositing a gate dielectric layer and then a gate conductor layer using conventional forming methods, such as chemical vapor deposition.

The substrate 10 includes, but is not limited to: any semiconducting material such conventional Si-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), annealed poly Si, and poly Si line structures.

When the substrate 10 is a silicon-on-insulator (SOI) or SiGe-on-insulator (SGOI) substrate, the thickness of the Si-containing layer atop the buried insulating layer can have a thickness on the order of 30 nm or greater. The SOI or SGOI substrate may be fabricated using techniques that are well known to those skilled in the art. For example, the SOI or SGOI substrate may be fabricated using a thermal bonding process, or alternatively be fabricated by an ion implantation process, which is referred to in the art as separation by ion implantation of oxygen (SIMOX).

Still referring to FIG. 7, the gate dielectric layer, formed atop the substrate 10, is typically an oxide material and is generally greater than 0.8 nm thick, and preferably about 1.0 nm to about 1.2 nm thick. The gate dielectric layer may also be composed of a nitride, oxynitride, or a combination thereof. The gate dielectric layer is formed using conventional techniques such as chemical vapor deposition (CVD), atomic layer CVD (ALCVD), pulsed CVD, plasma assisted CVD, sputtering, and chemical solution deposition, or alternatively, the gate dielectric layer is formed by a thermal growing process, which may include oxidation, oxynitridation, nitridation, and/or plasma or radical treatment. Suitable examples of oxides that can be employed as the gate dielectric layer include, but are not limited to: $SiO_2$, $Al_2O_3$, $ZrO_2$, $HfO_2$, $Ta_2O_5$, $TiO_2$, perovskite-type oxides and combinations and multi-layers thereof. The gate dielectric layer is subsequently etched to form the gate dielectric 2.

The gate conductor layer can be comprised of polysilicon or an appropriate metal. The gate conductor layer is formed atop the gate dielectric layer utilizing a conventional deposition process such as CVD and sputtering. Preferably, the gate conductor layer comprises doped polysilicon. The polysilicon dopant can be elements from group III-A or a group V of the Periodic Table of Elements. The dopant may be introduced during deposition of the gate conductor layer or following subsequent patterning and etch of the gate conductor 3.

A hardmask 8 is then formed atop the gate stack using deposition, photolithography, and highly selective etching. In one example, a hardmask layer is first deposited atop the gate stack and then patterned using photolithography and etching. The hardmask layer may comprise dielectrics systems that can be deposited by chemical vapor deposition (CVD) and related methods. Typically, hardmask compositions include silicon oxides, silicon carbides, silicon nitrides, silicon carbonitrides, etc. Spin-on dielectrics may also be utilized as the hardmask 8 including but not limited too: silsesquioxanes, siloxanes, and boron phosphate silicate glass (BPSG).

The hardmask layer is then patterned using photolithography. Specifically, a pattern is produced by applying a photoresist to the surface to be patterned; exposing the photoresist to a pattern of radiation; and then developing the pattern into the photoresist utilizing a conventional resist developer. Once the patterning of the photoresist is completed, the sections covered by the photoresist are protected, while the exposed regions are removed using a selective etching process that removes the unprotected regions of the hardmask layer forming the hardmask 8.

Following the formation of the hardmask 8, the gate stack is then etched by a directional etch process, such as reactive ion etch, having high selectivity to removing the material of the gate conductor layer and the gate dielectric layer without substantially etching the hardmask 8 and the substrate 10. The resultant gate region 5 includes a gate conductor 3 positioned atop a gate dielectric 2.

Following the formation of the patterned gate region 5, a protective layer 4 is formed about and protecting the patterned gate region 5. Preferably, the protection layer 4 is an oxide, such as $SiO_2$, produced by thermal oxidation of the gate region 5. Alternatively, the protective layer 4 is a nitride, such as $Si_3N_4$, produced by thermal nitridation. The protective layer 4 has a thickness ranging from about 2 nm to about 5 nm. The protective layer 4 may be omitted.

Figure 8:
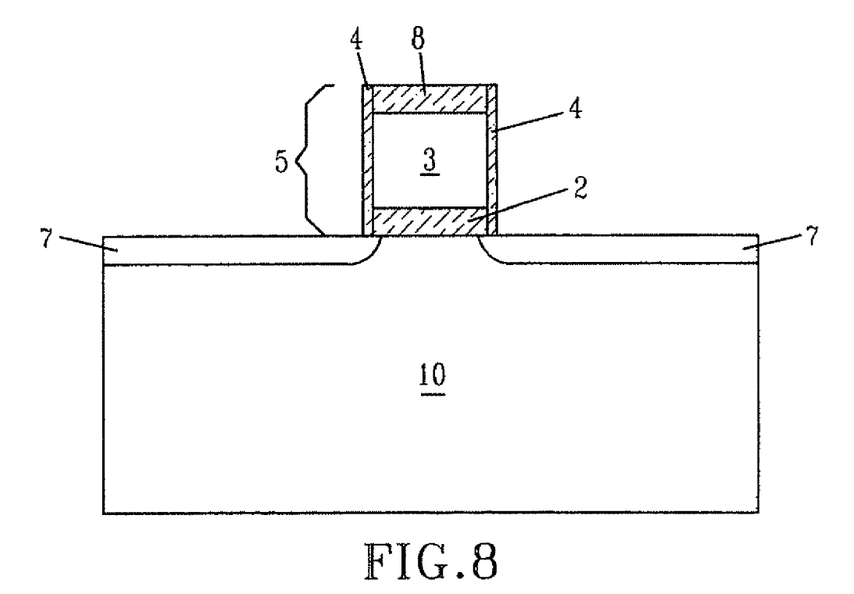

Referring to FIG. 8, source/drain extension regions 7 are then formed in substrate 10 and partially extend under the gate region 5. Source/drain extension regions 7 are formed via ion implantation and comprise a combination of normally incident and angled implants to form the desired grading in the extensions. PFET devices are produced within Si-containing substrates by doping the source/drain extension regions 7 with elements from group V of the Periodic Table of Elements. NFET devices are produced within Si-containing substrates by doping the source/drain extension regions 7 with elements from group III-A of the Periodic Table of Elements. Halo regions can also be formed beneath the source/drain extension regions 7 using an angled ion implantation and a dopant having a conductivity type opposite the source/drain extension regions 7.

Figure 9:
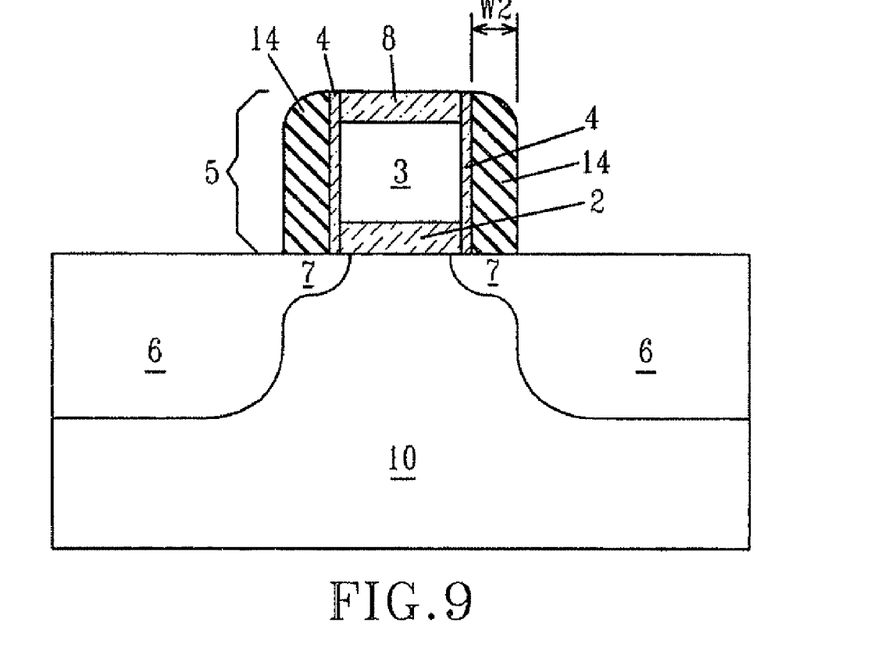

Referring to FIG. 9, following source/drain extension region 7 implants, sidewall spacers 14 are formed abutting the gate region 5. Sidewall spacers 14 are formed using conventional deposition and etch processes that are well known in the art. Sidewall spacers 14 have a sidewall spacer width W2 ranging from about 20 nm to about 60 nm; most preferably being about 10 nm. Sidewall spacers 14 can be comprised of a dielectric material such as a nitride or a combination of oxide and nitride materials. The sidewall spacer 14 most preferably comprises $Si_3N_4$.

Following sidewall spacer 14 formation, a higher energy ion implant is conducted to form deep source/drain regions 6. These implants are conducted at a higher energy and higher concentration of dopant than the source/drain extension region 7 implant. The deep source/drain regions 6 are typically doped with a dopant type consistent with the source/drain extension regions 7.

Following deep source/drain region 6 formation, the source/drain 6 and gate region 5 are activated by activation annealing using conventional processes such as, but not limited to: rapid thermal annealing, furnace annealing, flashlamp annealing or laser annealing. Activation anneal is conducted at a temperature ranging from about 850° C. to about 1350° C.

Figure 10:
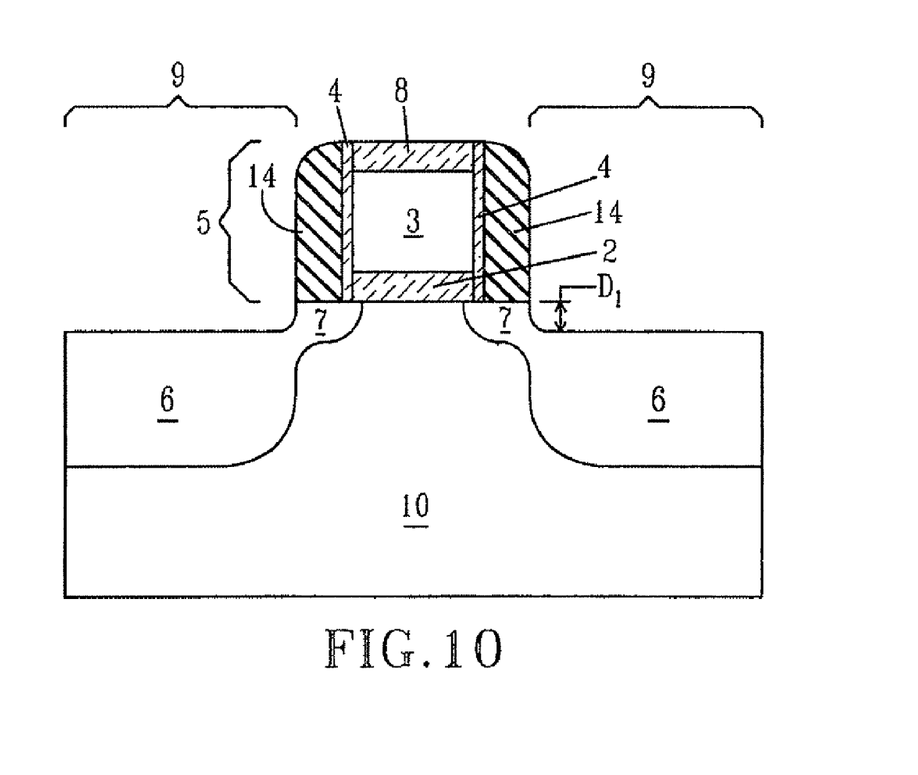

Referring to FIG. 10, the top surface of the substrate 10 is then etched to provide a recessed surface 9, on which the nitride liner is subsequently formed. During this etch process the gate conductor 3 is protected by the hardmask 8. The top surface of the substrate 10 is etched by a direction etch process, such as a reactive ion etch, having high selectivity to removing the Si-containing substrate 10 without substantially etching the hardmask 8 and the sidewall spacers 14. During this etch process, the hardmask 8 and the sidewall spacers 14 function as an etch mask that protects the portion of the substrate 10 underlying the gate region 5 and the sidewall spacers 14. The portion of the substrate 10 that is protected by the hardmask 8 and the sidewall spacers 14 during this etch process is referred to as the mesa portion 21 of the substrate 10. The etch process is preferably timed to recess the exposed portions of the substrate's upper surface to a depth $D_1$ ranging from about 30 nm to about 100 nm, preferably being 30 nm to 40 nm, measured from the top surface of the substrate 10 underlying the gate region 5. Following the etching process, the hardmask 8 may be removed using conventional processes such as selective etching.

In another embodiment of the present invention, the source/drain regions 6 may be formed after the surface of the substrate 10 is etched. In this embodiment, the source/drain implant and source/drain anneal are conducted after the formation of the recessed surfaces 9 of the substrate 10. By producing the source/drain regions 6 following substrate 10 etch, the contact resistance of the source/drain regions 6 may be reduced.

Figure 11A:
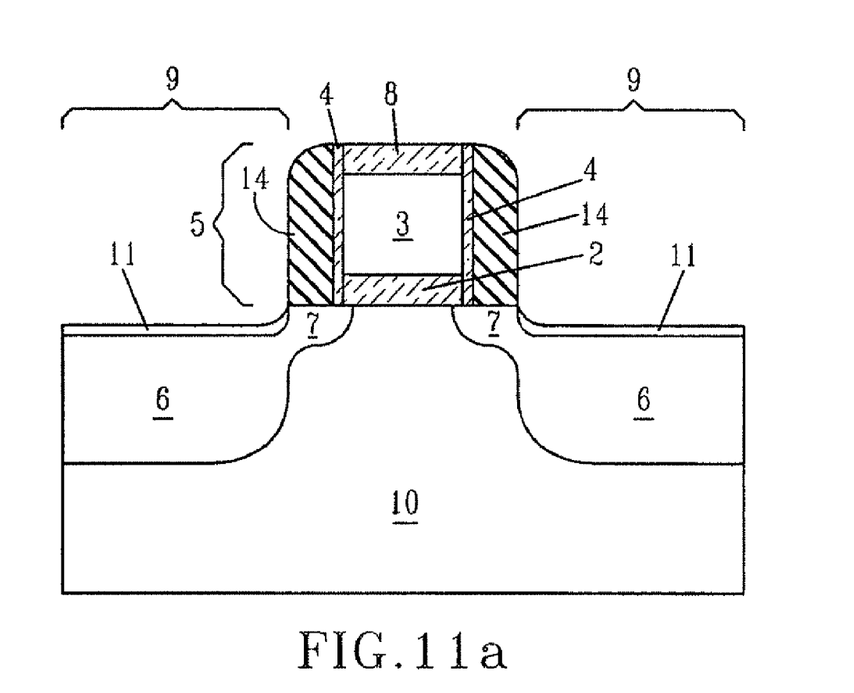

Referring to FIG. 1(a), in a next process step silicide regions 11 are then formed atop the recessed surface 9 and the source/drain regions 6. Silicide formation typically requires depositing a metal layer onto the surface of a Si-containing material or wafer. The metal layer may be formed using a conventional process including, but not limited to: chemical vapor deposition (CVD), plasma-assisted CVD, high-density chemical vapor deposition (HDCVD), plating, sputtering, evaporation and chemical solution deposition. Metals deposited for silicide formation include Ta, Ti, W, Pt, Co, Ni, and combinations thereof, most preferably being Co or Ni. Following deposition, the structure is then subjected to an annealing step using conventional processes such as, but not limited to: rapid thermal annealing. During thermal annealing, the deposited metal reacts with Si forming a metal silicide. The silicide region 11 can decrease the depth of the recessed surface 9 from the portion of the substrate underlying the gate region 5 by about 11 mm.

Figure 11B:
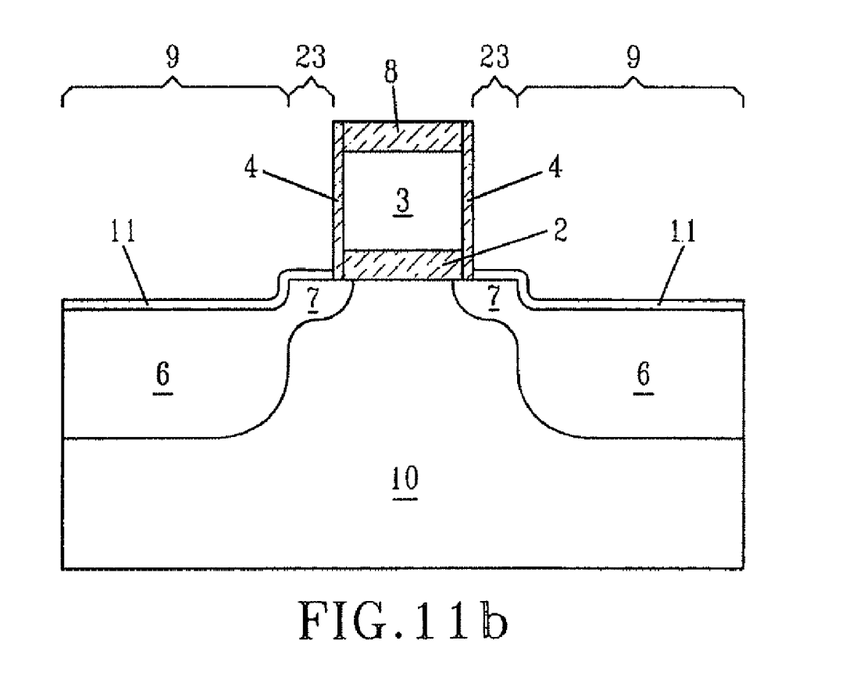

Referring to FIG. 11(b), in another embodiment of the present invention, the sidewall spacers 14 are removed prior to the deposition of the subsequently formed nitride layer. The sidewall spacers 14 may be removed using a highly selective etch process that removes the sidewall spacers 14 without substantially etching the substrate 10, the gate conductor 3, the silicide regions 11, and the protective layer 4.

Figure 12A:
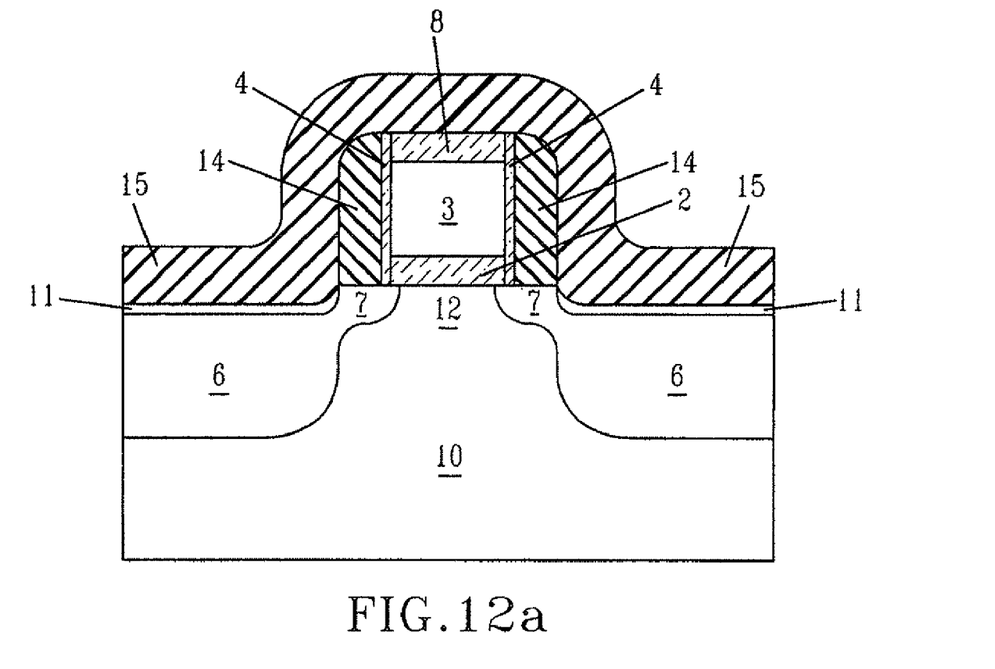

Referring to FIG. 12(a), a nitride liner 15 is then deposited atop the entire structure depicted in FIG. 11(a). The nitride liner 15 produces a longitudinal stress on the portion of the substrate underlying the gate region 5. Preferably, the nitride liner 15 produces a stress in a portion of the device channel 12 of the substrate 11 positioned about 50 nm below the gate region 5. The stress may range from about 250 MPa to about 450 MPa. The nitride liner 15 preferably comprises $Si_3N_4$ and may have a thickness ranging from about 40 nm to about 100 nm, preferably being about 50 nm. The nitride liner 15 may be deposited by plasma enhanced chemical vapor deposition or rapid thermal chemical vapor deposition.

The stress produced by the nitride liner 15 may be in a compressive or tensile state. Modifying the process conditions of the nitride liner 15 forming method can control whether the state of stress is tensile or compressive. Plasma enhanced chemical vapor deposition (PECVD) can provide nitride liners 15 having a compressive or tensile internal stress. The stress state of the nitride liner 15 deposited by PECVD can be controlled by changing the deposition conditions to alter the reaction rate within the deposition chamber. More specifically, the stress state of the deposited nitride liner 15 may be set by changing the deposition conditions such as: $SiH_4/N_2$/He gas flow rate, pressure, RF power, and electrode gap. Although wishing not to be limited, it is believed that the incorporation of H into the nitride layer 15 increases the compressive nature of the layer. Rapid thermal chemical vapor deposition (RTCVD) can provide nitride liners 15 having an internal tensile stress. The magnitude of the internal tensile stress produced within the nitride liner 15 deposited by RTCVD can be controlled by changing the deposition conditions. More specifically, the magnitude of the tensile stress within the deposited nitride layer 15 may be set by changing deposition conditions such as: precursor composition, precursor flow rate and temperature.

Figure 12B:
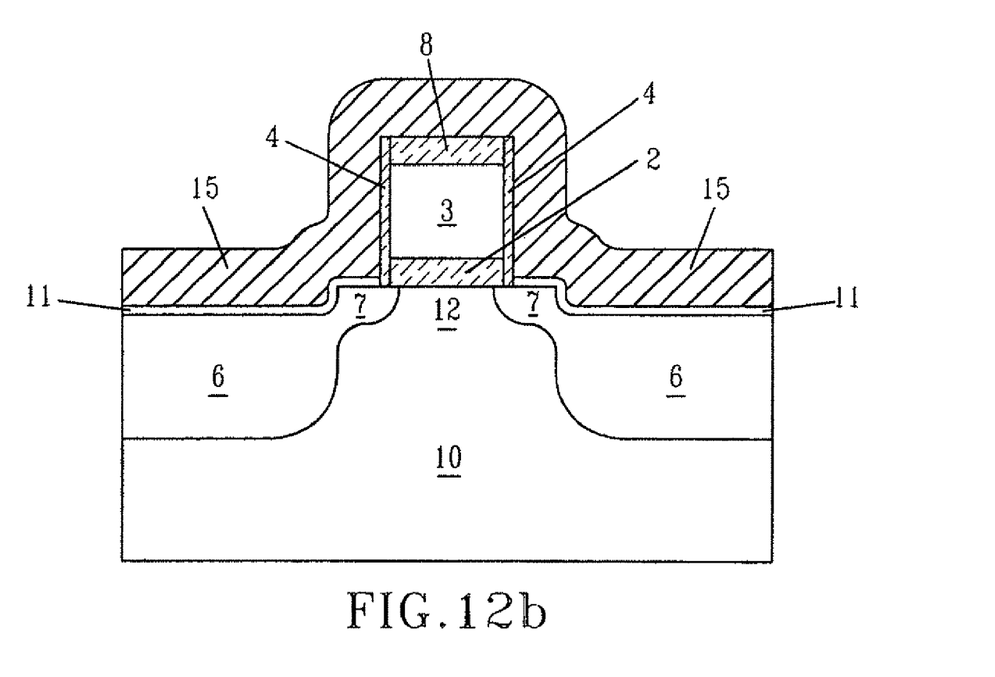

FIG. 12(b) depicts depositing the nitride liner 15 atop the gate structure depicted in FIG. 11(b). In this embodiment, the nitride liner 15 is deposited following the removal of the sidewall spacers 14. By removing the sidewall spacers 14 prior to nitride liner 15 deposition, the nitride liner 15 is positioned in closer proximity to the sidewall portions of the gate structure 5 than previously possible when a sidewall spacer abutted the gate structure 5.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:
1. A structure comprising:
a semiconductor substrate having a mesa portion and recessed surfaces, wherein said mesa portion contains a mesa top surface and mesa sidewalls located above and adjoined to said recessed surfaces, and wherein said mesa top surface is vertically offset from said recessed surfaces;
a single gated transistor comprising a gate region including a gate dielectric and a gate electrode, wherein said gate dielectric abuts said mesa top surface and is disjoined from said recessed surfaces and said mesa sidewalls;

sidewall spacers abutting said mesa top surface, wherein outer sidewalls of said sidewall spacers contiguously extend vertically from said mesa sidewalls to a top portion of said sidewall spacers without a horizontal surface below a topmost surface of said gate electrode and are aligned to said mesa sidewalls;

source and drain regions located under and aligned to said recessed surfaces, wherein a boundary of said source region is substantially aligned to an outer sidewall of said sidewall spacers in a vertical direction, and a boundary of said drain region is substantially vertically aligned to another outer sidewall of said sidewall spacers in said vertical direction;

a nitride liner abutting said sidewall spacers, said mesa sidewalls, and said recessed surfaces and not abutting said mesa top surface, wherein said nitride liner provides a longitudinal stress to a device channel underlying said gate region in said mesa portion of said semiconductor substrate; and source and drain extension regions located under and aligned to said mesa portion and extending beneath said sidewall spacers, wherein a bottommost planar surface of said source extension region and a bottommost planar surface of said drain extension region are located below a horizontal plane including said recessed surfaces.

2. The structure of claim 1 wherein said nitride liner comprises $Si_3N_4$.

3. The structure of claim 1 wherein said nitride liner has a thickness ranging from about 40 nm to about 100 nm.

4. The structure of claim 1 wherein said stress is produced in a portion of said device channel positioned about 5 nm or less below said gate region.

5. The structure of claim 1 wherein said mesa top surface is vertically offset from said recessed surfaces by a depth ranging from about 10 nm to about 80 nm.

6. The structure of claim 1 wherein the substrate comprises Si, bulk Si, single crystal Si, polycrystalline Si, SiGe, amorphous Si, silicon-on-insulator (SOI), SiGe-on-insulator (SGOI), annealed poly Si, poly Si line structures, GaAs, InAs, or a combination thereof.

7. The structure of claim 1 wherein said stress on said device channel, is a longitudinal stress ranging from about 250 MPa to about 450 MPa.

8. The structure of claim 1 wherein said sidewall spacer has a width ranging from about 20 nm to about 60 nm.

9. The structure of claim 1 further comprising a silicide region abutting and located beneath said recessed surfaces.

10. The structure of claim 1 further comprising source and drain extension regions located under and aligned to said mesa portion and extending beneath said sidewall spacers.

11. The structure of claim 1 further comprising a protective layer comprising a material selected from the group consisting of an oxide and a nitride, and having a thickness from about 2 nm to about 5 nm, wherein said protective layer abuts said gate electrode and said sidewall spacers.

12. A structure comprising:
a semiconductor substrate having a mesa portion and recessed surfaces, wherein said mesa portion contains a mesa top surface and mesa sidewalls located above and adjoined to said recessed surfaces, and wherein said mesa top surface is vertically offset from said recessed surfaces;

a single gated transistor comprising a gate region including a gate dielectric and a gate electrode, wherein said gate dielectric abuts said mesa top surface and is disjoined from said recessed surfaces and said mesa sidewalls;

sidewall spacers abutting said mesa top surface, wherein outer sidewalls of said sidewall spacers contiguously extend vertically from said mesa sidewalls to a top portion of said sidewall spacers without a horizontal surface below a topmost surface of said gate electrode and are aligned to said mesa sidewalls;

source and drain regions located under and aligned to said recessed surfaces and substantially aligned to said sidewall spacers;

source and drain extension regions located under and aligned to said mesa portion and extending beneath said sidewall spacers, wherein a bottommost planar surface of said source extension region and a bottommost planar surface of said drain extension region are located below a horizontal plane including said recessed surfaces; and a nitride liner abutting said sidewall spacers, said mesa sidewalls, and said recessed surfaces and not abutting said mesa top surface, wherein said nitride liner provides a longitudinal stress to a device channel underlying said gate region in said mesa portion of said semiconductor substrate.

13. The structure of claim 12 wherein said nitride liner comprises $Si_3N_4$.

14. The structure of claim 12 wherein the substrate comprises Si, bulk Si, single crystal Si, polycrystalline Si, SiGe, amorphous Si, silicon-on-insulator (SOI), SiGe-on-insulator (SGOI), annealed poly Si, poly Si line structures, GaAs, InAs, or a combination thereof.

15. The structure of claim 12 wherein a boundary of said source region is substantially aligned to an outer sidewall of said sidewall spacers in a vertical direction, and a boundary of said drain region is substantially vertically aligned to another outer sidewall of said sidewall spacers in said vertical direction.

16. The structure of claim 12 further comprising a silicide region abutting and located beneath said recessed surfaces.

17. The structure of claim 12 further comprising source and drain extension regions located under and aligned to said mesa portion and extending beneath said sidewall spacers.

18. The structure of claim 12 further comprising a protective layer comprising a material selected from the group consisting of an oxide and a nitride, and having a thickness from about 2 nm to about 5 nm, wherein said protective layer abuts said gate electrode and said sidewall spacers.

* * * * *